(12) United States Patent  (10) Patent No.: US 7,921,352 B2
Choi et al.  (45) Date of Patent: Apr. 5, 2011

(54) DTV TRANSMITTER AND METHOD OF CODING MAIN AND ENHANCED DATA IN DTV TRANSMITTER

(75) Inventors: In Hwan Choi, Gyeonggi-do (KR); Kyung Won Kang, Seoul (KR); Kook Yeon Kwak, Gyeonggi-do (KR); Byoung Gill Kim, Seoul (KR); Woo Chan Kim, Gyeonggi-do (KR); Jae Hyung Kim, Seoul (KR); Hyoung Gon Lee, Seoul (KR); Jong Moon Kim, Gyeonggi-do (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 12/834,815

(22) Filed: Jul. 12, 2010

(65) Prior Publication Data

US 2010/0281346 A1  Nov. 4, 2010

Related U.S. Application Data

(63) Continuation of application No. 11/564,821, filed on Nov. 29, 2006, now Pat. No. 7,783,960.

(60) Provisional application No. 60/825,267, filed on Sep. 11, 2006.

(30) Foreign Application Priority Data

Nov. 30, 2005 (KR) .................. 10-2005-0116042

(51) Int. Cl.
 *H03M 13/00* (2006.01)

(52) U.S. Cl. .................................................... 714/784
(58) Field of Classification Search ............ 714/755, 714/784, 786
 See application file for complete search history.

(56) References Cited

U.S. PATENT DOCUMENTS 7,111,221 B2 * 9/2006 Birru et al. ............... 714/755
7,450,613 B2 11/2008 Choi et al.
7,599,348 B2 10/2009 Kang et al.

FOREIGN PATENT DOCUMENTS

WO 2005-071958 8/2005
WO 2005-109878 11/2005

OTHER PUBLICATIONS

Touzni et al., Ehanced 8-VSB transmission for North-American HDTV terrestrial broadcast, 2003, IEEE, p. 437-440.*

(Continued)

*Primary Examiner* — Shelly A Chase
(74) *Attorney, Agent, or Firm* — Lee, Hong, Degerman, Kang & Waimey

(57) ABSTRACT

A DTV transmitter includes a pre-processor pre-processing enhanced data, a data formatter generating enhanced data packets including the pre-processed data and inserting known data place holders to the data packets, and a multiplexer multiplexing the enhanced data packets with main data packets. It further includes an RS encoder which RS-codes the multiplexed data packets, and a data interleaves which interleaves the RS-coded data packets. The RS encoder adds systematic RS parity data to each main data packet and adds non-systematic RS parity place holders to each enhanced data packet. The RS encoder adds the RS parity place holders such that the RS parity place holders are placed after the enhanced data within each interleaved enhanced data packet.

8 Claims, 9 Drawing Sheets

OTHER PUBLICATIONS

Seung-Won Kim et al., Enhanced-x VSB system develpoment for mobile protable reception, 2005, IEEE, p. 419-423.*

Gaddam, V. R., et al., "A Newly Proposed ATSC DTV System For Transmitting A Robust Bit-Stream Along With The Standard Bit-Stream", IEEE Transactions on Consumer Electronics, XP001201224; vol. 49; Issue 4; pp. 933-38; Nov. 2003.

Kim, Sung-Hoon, et al., "Enhanced-x VSB System Development for Improving ATSC Terrestrial DTV Transmission Standard", IEEE Transactions On Broadcasting; vol. 52; No. 2; pp. 129-132; Jun. 2006.

* cited by examiner

Byte Expansion by null bit insertion (1 byte => 2 bytes)

Byte Expansion by null bit insertion (1 byte => 2 bytes)

Byte Expansion by bit repetition (1 byte => 2 bytes)

Byte Expansion by null bit insertion (1 byte => 4 bytes)

Byte Expansion by null bit insertion (1 byte => 4 bytes)

Byte Expansion by bit repetition (1 byte => 4 bytes)

| M2M1M0 | 1st Z2Z1/2nd Z2Z1 |
|---|---|
| 000 | 00/00 or 10/10 |
| 001 | 00/01 or 10/11 |
| 010 | 01/00 or 11/10 |
| 011 | 01/01 or 11/11 |
| 100 | 00/10 or 10/00 |
| 101 | 00/11 or 10/01 |
| 110 | 01/10 or 11/00 |
| 111 | 01/11 or 11/01 |

DTV TRANSMITTER AND METHOD OF CODING MAIN AND ENHANCED DATA IN DTV TRANSMITTER

CROSS-REFERENCE TO RELATED APPLICATIONS

This application is a continuation of U.S. application Ser. No. 11/564,821 filed on Nov. 29, 2006 (and issued as U.S. Pat. No. 7,783,960 on Aug. 24, 2010), which claims the benefit of and right of priority to the Korean Patent Application No. 10-2005-0116042, filed on Nov. 30, 2005, and U.S. Provisional Application No. 60/825,267, filed on Sep. 11, 2006, the contents of which are hereby incorporated by reference herein in their entireties.

BACKGROUND OF THE INVENTION

1. Field of the Invention

The present invention relates to a digital telecommunications system, and more particularly, to a digital television (DTV) transmitter and a method of coding main and enhanced data in a DTV transmitter.

2. Discussion of the Related Art

The Terrestrial-Vestigial Side Band (T-VSB) transmission mode, which is adopted as the standard for digital broadcasting in North America and the Republic of Korea, is a system that has been developed for the transmission of MPEG video/audio data. However, presently, the technology for processing digital signals is being developed at a vast rate, and, as a larger number of the population uses the Internet, digital electric appliances, computers, and the Internet are being integrated. Therefore, in order to meet with the various requirements of the users, a system that can add video/audio data through a digital television channel so as to transmit diverse supplemental information needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the MPEG video/audio data. However, with the advent of digital broadcasting, ATSC VSB digital television receivers that receive only MPEG video/audio data are already supplied to the market. Therefore, the supplemental data that are transmitted through the same channel as the MPEG video/audio data should not influence the conventional ATSC VSB receivers that are provided in the market. In other words, this may be defined as ATSC VSB compatibility, and the supplemental data broadcast system should be compatible with the ATSC VSB system. Herein, the supplemental data may also be referred to as enhanced data or E-VSB data. Furthermore, in a poor channel environment, the receiving performance of the conventional ATSC VSB receiving system may be deteriorated. More specifically, resistance to changes in channels and noise is more highly required when using portable and/or mobile receivers.

SUMMARY OF THE INVENTION

Accordingly, the present invention is directed to a digital television (DTV) transmitter and a method of coding main and enhanced data for data, transmission in a DTV transmitter that substantially obviate one or more problems due to limitations and disadvantages of the related art.

An object of the present invention is to provide a digital television system that is suitable for transmitting supplemental data and that is highly resistant to noise.

Another object of the present invention is to provide a digital broadcasting system and method of processing data that can insert known data in a specific domain of the supplemental data and transmitting the data to a DTV transmitter/receiver, thereby enhancing the receiving performance of the digital television system.

A further object of the present invention is to provide a digital broadcasting system and processing method for efficiently inserting and transmitting the known data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) receiver includes a pre-processor, a data formatter, a multiplexer, an RS encoder, and a data interleaver. The pre-processor may pre-process the enhanced data by coding the enhanced data for forward error correction (FEC) and expand the FEC-coded enhanced data. The data formatter may generate enhanced data packets including the pre-processed enhanced data and insert known data place holders to at least one of the enhanced data packets. The multiplexer may multiplex the enhanced data packets with main data packets including the main data. The RS encoder may RS-code the multiplexed main and enhanced data packets, the RS encoder adds systematic RS parity data to each main data packet and adds non-systematic RS parity place holders to each enhanced data packet. The data interleaver may interleave the RS-coded main and enhanced data packets, wherein the non-systematic RS parity place holders are placed after the enhanced data within each interleaved enhanced data packet.

The data interleaver may replace the RS parity place holders included in each interleaved enhanced data packet with non-systematic RS parity data.

The DTV transmitter may further include a known data, a byte-symbol converter, a symbol processor, and a trellis encoder. The known data generator may generate known data symbols. The byte-symbol converter may convert the interleaved data packets into corresponding symbols. The symbol processor may process the symbols, the symbol processor encodes symbols corresponding to the enhanced data and replaces symbols corresponding to the known data place holders with the known data symbols. The trellis encoder may trellis-encode the symbols processed by the symbol processor, the trellis encoder is initialized when the symbols outputted from the symbol processor are symbols representing a beginning of a known data sequence.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.
In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather information, and so on, or consist of video/audio data. Additionally, the known data refer to data already known based upon a pre-determined agreement between the transmitter and the receiver. Furthermore, the main data consist of data that can be received from the conventional receiving system, wherein the main data include video/audio data.

The present invention relates to inserting known data known by the transmitter/receiver in a specific position of an enhanced data packet and transmitting the processed data packet, thereby enhancing the receiving performance of the receiving system. Most particularly, the present invention relates to multiplexing the enhanced data including the known data and the main data in packet units, thereby performing additional encoding of only the enhanced data when encoding the multiplexed data in a symbol domain. Finally, the present invention enables a long known data sequence to be inserted consecutively, thereby enhancing the degree of freedom for deciding the inserting position of the known data sequence.

Figure 1:
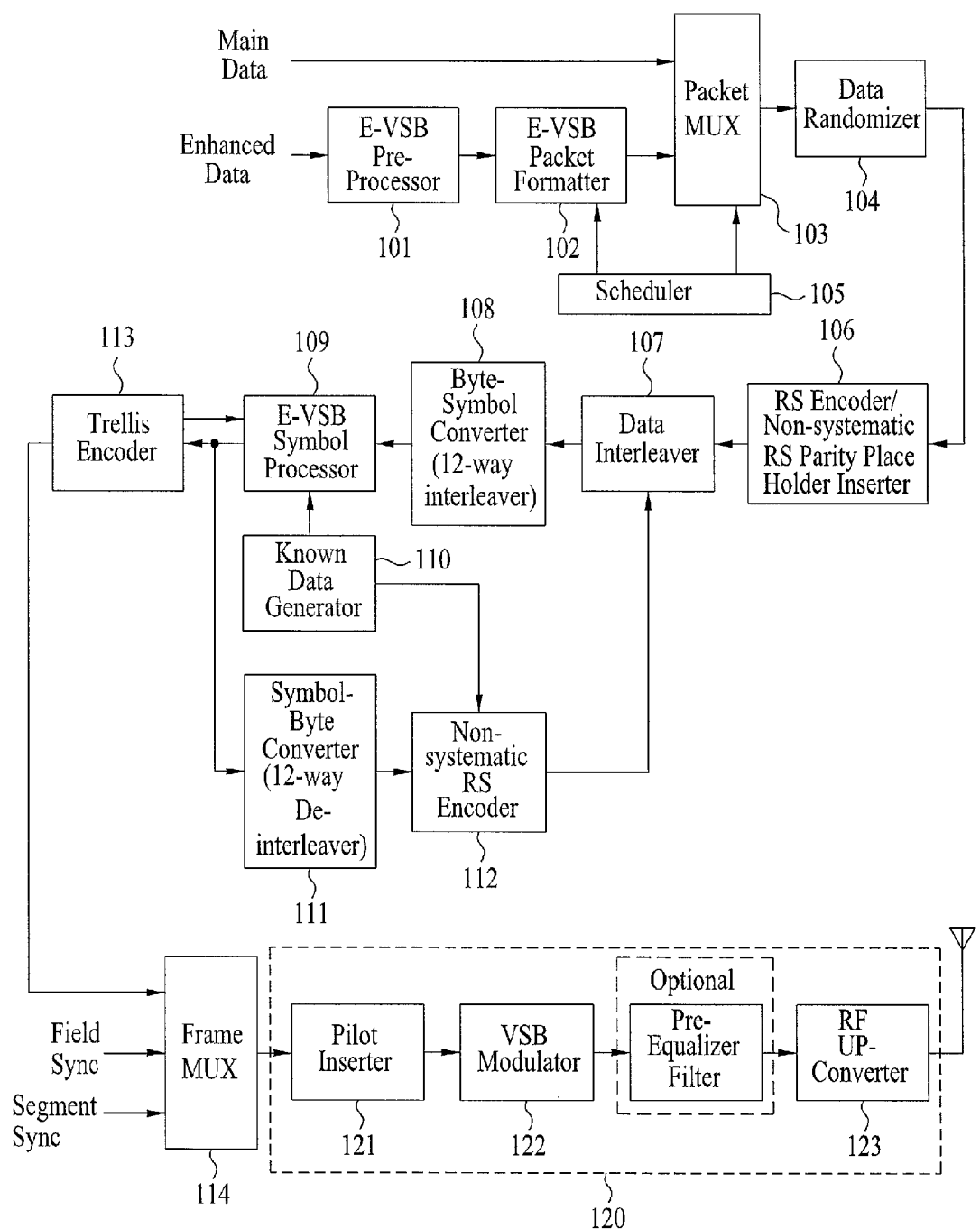
FIG. 1 illustrates a block view of a digital broadcast transmitting system according to the present invention.

FIG. 1 illustrates a block view of a digital broadcast transmitting system according to the present invention. The digital broadcast transmitting system includes an E-VSB pre-processor 101, an E-VSB packet formatter 102, a packet multiplexer 103, a data randomizer 104, a scheduler 105, a Reed-Solomon (RS) encoder/non-systematic Reed-Solomon (RS) parity place holder inserter 106, a data interleaver 107, a byte-symbol converter 108, an E-VSB symbol processor 109, a known data generator 110, a symbol-byte converter 111, a non-systematic RS encoder 112, a trellis encoder 113, a frame multiplexer 114, and a transmitter 120.

In the present invention having the above-described structure, a main data packet is outputted to the packet multiplexer 103, and enhanced data are outputted to the E-VSB pre-processor 101. The E-VSB pre-processor 101 pre-processes the enhanced data, such as encoding additional error correction, interleaving, and inserting null data, and then outputs the pre-processed enhanced data to the E-VSB packet formatter 102.

Based upon the control of the scheduler 105, the E-VSB packet formatter 102 multiplexes the pre-processed enhanced data and the known data place holder having the null data inserted therein, thereby configuring a group. Herein, the known data place holder ensures in advance the position (or place) in which the known data are to be inserted in a later process. The data within the group are then divided into 184-byte unit enhanced data packets, and a 4-byte MPEG header is added to the beginning of the enhanced data packet, thereby outputting a 188-byte enhanced data packet (i.e., a MPEG compatibility packet). Herein, the MPEG header is configured of a 1-byte MPEG synchronization byte (0x47) and a 3-byte packet identification (Pin). In addition, one enhanced data packet group includes a plurality of consecutive enhanced data packets.

The output of the E-VSB packet formatter 102 is inputted to the packet multiplexer 103. The packet multiplexer 103 time-division multiplexes the main data packet and the enhanced data packet group in transport stream (TS) packet units and outputs the multiplexed TS packet in accordance with the control of the scheduler 105. More specifically, the scheduler 105 generates and outputs a control signal so that the packet formatter 102 can multiplex the main data packet and the enhanced data packet group. Accordingly, the packet multiplexer 103 receives the control signal, thereby multiplexing and outputting the main data packet and the enhanced data packet group to TS packet units.

The output data of the packet multiplexer 103 are inputted to the data randomizer 104. The data randomizer 104 discards (or deletes) the MPEG synchronization byte and randomizes the remaining 187 bytes by using a pseudo-random byte, which is generated from inside the data randomizer 104. Thereafter, the randomized data are outputted to the Reed-Solomon (RS) encoder/non-systematic RS parity place holder inserter 106. The RS encoder/non-systematic RS parity place holder inserter 106 processes the randomized data with either a systematic RS-coding process or a non-systematic RS parity place holder insertion process. More specifically, when the 187-byte packet that is outputted from the data randomizer 104 corresponds to the main data packet, RS encoder/non-systematic RS parity place holder inserter 106 performs the same systematic RS-coding as the conventional ATSC VSB system, thereby adding a 20-byte parity byte at the end of the 187-byte data and outputting a 207-byte packet. The rule (or principle) of inserting the 20 null data bytes within the enhanced data packet will be described in a later process. Herein, the null byte may be given an arbitrary value, and such null byte value may be substituted with the parity value calculated by the non-systematic RS encoder 112 in a later process. Accordingly, the role of the null byte is to ensure the parity byte position (or place) of a non-systematic RS code.

The non-systematic RS code is used for the enhanced data packet for the following reason. When the value of the enhanced data is changed by the E-VSB symbol processor 109, which will be described in detail in a later process, the RS parity should be recalculated. And so, the parity bytes should be outputted from the data interleaver 107 output terminal later than the data bytes. For example, when K number of data bytes are received and P number of parity bytes are added thereto so as to be RS-coded, P number of arbitrary bytes among the total N(=K+P) number of bytes may be used as the parity bytes.

The output of the RS encoder/non-systematic RS parity place holder inserter 106 is configured of a 207-byte packet. The order in which the bytes within the packet are outputted from the encoder/inserter 106 is determined in accordance with Equation 1 below.

$$b=((52 \times p)+(s \bmod 52)) \bmod 207, p=0, 1, \ldots, 206 \quad \text{Equation 1}$$

Herein, s indicates a segment (or packet) number following the field synchronization signal, and the value of s ranges from 0 to 311. Also, b indicates a byte position within the segment (or packet), and the value of b ranges from 0 to 206. More specifically, s and b respectively represents each position of the segment (or packet) and the byte position both being inputted to the data interleaver 107. Furthermore, 52 indicates an invariable number pre-decided by the data interleaver 107. And, finally, mod signifies a modulo operation.

Generally, in the ATSC VSB system, one transport packet is interleaved by the data interleaver, thereby being dispersed and outputted by a plurality of data segments. However, since one 207-byte packet has the data size equal to that of one data segment, the packet may also be used as a segment prior to the interleaving process. Therefore, when the values 0 to 206 are respectively substituted for p, the obtained value b represents the position (or location) of the parity byte being inputted into the data interleaver 107. For example, in the above Equation 1, in the first segment (wherein s=0), when the values p=0 to p=206 are respectively substituted, the RS parity place holder is inputted into the data interleaver 107 in a byte order of b=0, 52, 104, 156, 1, 53, 105, 157, and so on.

Accordingly, when the input data correspond to the enhanced data packet, the RS encoder/non-systematic RS parity place holder inserter 106 inserts a non-systematic RS parity place holder in a 20-byte place being outputted the latest from the output end of the data interleaver 107 among the byte places excluding the MPEG header byte place and the known data byte place. More specifically, the 20 bytes that are to be outputted the latest by the data interleaver 107, among the bytes in the domain excluding the MPEG header byte and known data byte places, are decided as the RS parity place holder. In other words, when viewed from the output end of the data interleaver 107, the known data place holder may either be outputted later or be outputted earlier than the parity place holder. The location of the parity byte being inputted into the data interleaver 107 is determined in accordance with the Equation 1. And, as shown in Equation 1, the place of the non-systematic RS parity byte of each segment (or packet) is different from one another.

The output data of the RS encoder/parity place holder inserter 106 are provided to the data interleaver 107. Then, the data interleaver 107 interleaves and outputs the received data. At this point, the data interleaver 107 receives a RS parity byte that is newly calculated and outputted by the non-systematic RS encoder 112 and, then, outputs the newly received RS parity byte instead of the non-systematic RS parity place holder. Each byte outputted from the data interleaves 107 is converted into 4 symbols by the byte-symbol converter 108, which are then inputted to the E-VSB symbol processor 109. Herein, one symbol consists of 2 bits. Additionally, the known data generated (or created) from the known data generator 110 are also inputted to the E-VSB symbol processor 109. Herein, the known data consist of the known data symbol generated from the symbol domain. This is because the known data are used in the symbol domain of the receiving system. Also, in the transmitting system, it is more efficient to create a known data symbol sequence having the characteristics desired (or required) by the symbol domain.

The E-VSB symbol processor 109 receives the data outputted from the byte-symbol converter 108 and the known data symbol generated from the known data generator 110, processes the received data with a plurality of processing steps. Thereafter, the E-VSB symbol processor 109 outputs the processed data to the trellis encoder 113. In other words, the E-VSB symbol processor 109 receives the symbol configured of 2 bits and performs a predetermined process. Then, the E-VSB symbol processor 109 outputs processed symbol configured of 2 bits. In case of a main data symbol, the E-VSB symbol processor 109 outputs the received symbol without any change in data. On the other hand, in case of an enhanced data symbol, the received symbol is processed with a signal process that can provide additional coding gain when used in connection with the trellis encoder 113. However, in the 207-byte enhanced data packet, the 3-byte MPEG header and known data byte and the 20-byte RS parity byte are processed as the main data symbol. Therefore, the bytes are directly outputted without any change in the data value(s).

As described above, having the 3-byte MPEG header and known data byte and the 20-byte RS parity byte be directly outputted from the E-VSB symbol processor 109 without any change in data value, and having the corresponding bytes outputted from the output end of the data interleaver later than the non-systematic RS parity byte, since only the pre-decided values are used, do not affect the non-systematic RS-coding process. Accordingly, the degree of freedom in choosing the insertion position (or place) of the known data may be increased, thereby allowing a consecutive and long known data sequence to by obtained from the receiver.

Meanwhile, when the input data inputted to the E-VSB symbol processor 109 correspond to the known data place holder that is converted to a symbol by the byte-symbol converter 108, the E-VSB symbol processor 109 uses the known data generated from the known data generator 110 instead of the known data place holder. The E-VSB symbol processor 109 then generates a known data symbol at the beginning of the known data sequence so that the memory of the trellis encoder 113 is initialized to a pre-decided state. In order to do so, the memory value within the trellis encoder 113 should be inputted to the E-VSB symbol processor 109.

Further, the memory value of the trellis encoder 113 may also be used in an additional signaling process for the enhanced data symbol. Additionally, the trellis encoder 113 is initialized at the beginning of the known data sequence because a plurality of output sequences may be generated depending upon the memory state of the trellis encoder 113 even when the known data sequence is inputted to the trellis encoder 113. Accordingly, the memory state of the trellis encoder 113 is first initialized to a pre-decided value and, then, when the known data are inputted, a desired known data output sequence may be obtained from the output of the trellis encoder 113.

In order to initialize the memory of the trellis encoder 113, two symbols are required. And, since the VSB transmitting system includes 12 trellis encoders, a total of input symbols are used for the initialization process. More specifically, all of the 12 trellis encoders used in the ATSC VSB system are identical to one another. Therefore, 12 identical E-VSB symbol processors are also required in the structure. The output symbol of the E-VSB symbol processor 109 is inputted to the trellis encoder 113 so as to be trellis-encoded.

The trellis encoder 113 pre-codes the data that are inputted as the upper bit among the output symbols of the E-VSB symbol processor 109, and trellis-encodes the data that are inputted as the lower bit. Thereafter, the pre-coded data and the trellis-encoded data are outputted to the frame multiplexer 114. Meanwhile, the E-VSB symbol processor 109 receives the 2-bit symbol, processes the received symbol with a plurality of process steps, and outputs the processed symbol. Therefore, the symbol should be converted back to bytes from the symbol-byte converter 111 so that the non-systematic RS encoder 112 can recalculate the RS parity from the output of the E-VSB symbol processor 109. In other words, the input symbol is converted to byte units from the symbol-byte converter 111 and outputted to the non-systematic RS encoder 112. The non-systematic RS encoder 112 calculates the 20-byte RS parity for the data packet configured of 187 information bytes and outputs the calculated RS parity to the data interleaver 107. The data interleaver 107 receives the RS parity byte calculated and outputted from the non-systematic RS encoder 112 and replaces the non-systematic place holder that is not yet outputted with the received RS parity byte.

Herein, since the enhanced data symbol and the known data place holder are changed to different values by the E-VSB symbol processor 109, a decoding error occurs when performing a RS decoding process in the conventional ATSC VSB receiver. The non-systematic RS coding process is performed in order to prevent such decoding error from occurring. Meanwhile, the non-systematic RS encoder 112 receives the output of the known data generator 110 so that the symbol-byte converter 111 can receive in advance the known data being outputted later than the RS parity byte.

The frame multiplexer 114 inserts 4 segment synchronization symbols in each output symbol of the trellis encoder 113, thereby configuring a data segment having 832 data symbols. More specifically, one field synchronization segment is inserted in each of the 312 data segments, so as to configure one data field, which is then outputted to the transmitter 120. The transmitter 120 inserts a pilot signal in the output of the frame multiplexer 114, the output having a segment synchronization signal and a field synchronization signal inserted therein. The transmitter 120 then VSB modulates the pilot signal inserted data and converts the VSB modulated data to an RF signal, which is transmitted through the antenna. Accordingly, the transmitter 120 includes a pilot inserter 121, a VSB modulator 122, and a RF-UP converter 123. Furthermore, a pre-equalizer filter may be optionally included.

Figure 2A:
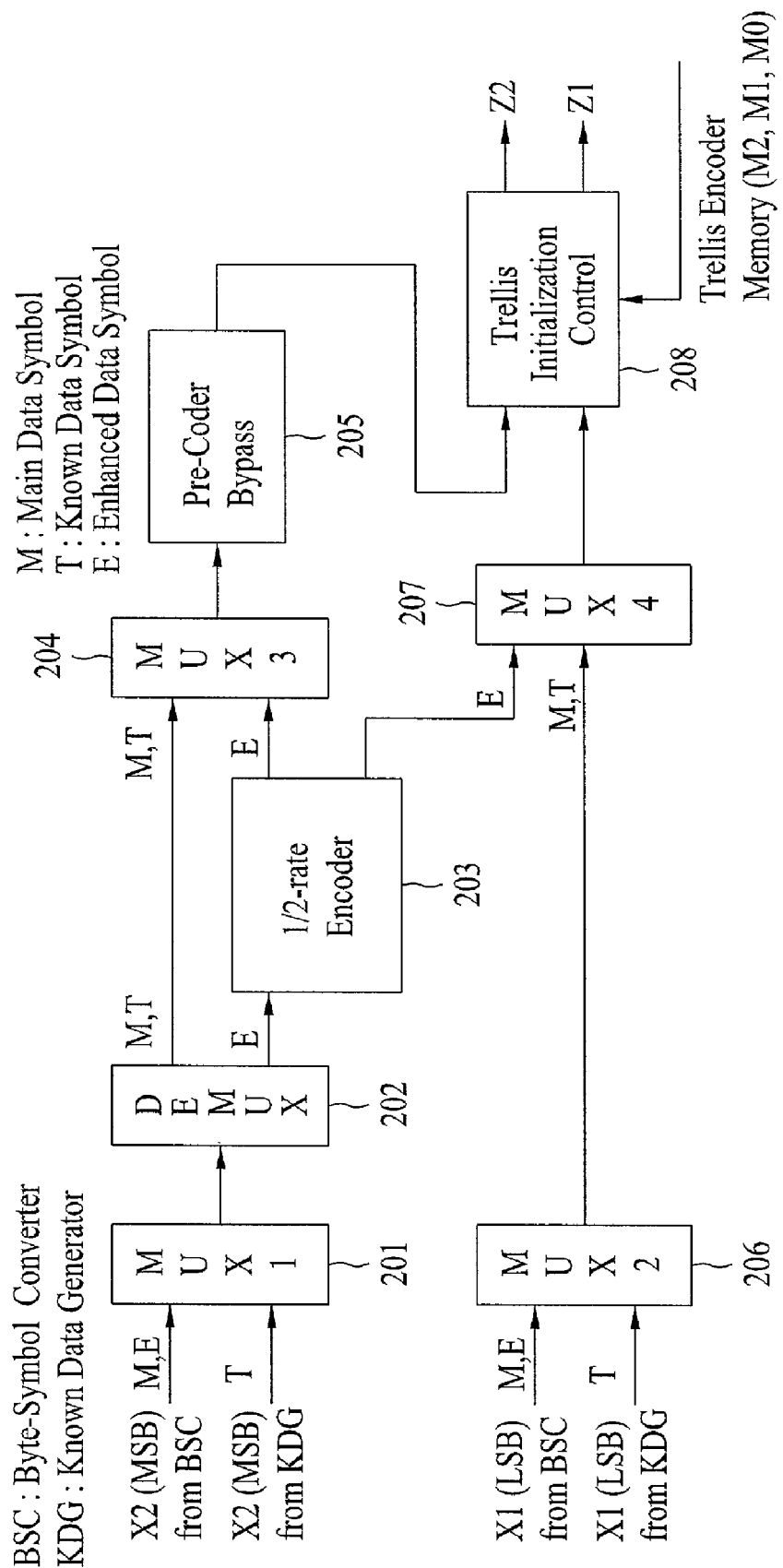
FIG. 2A illustrates a block view of an E-VSB symbol processor according to an embodiment of the present invention.
Figure 2B:
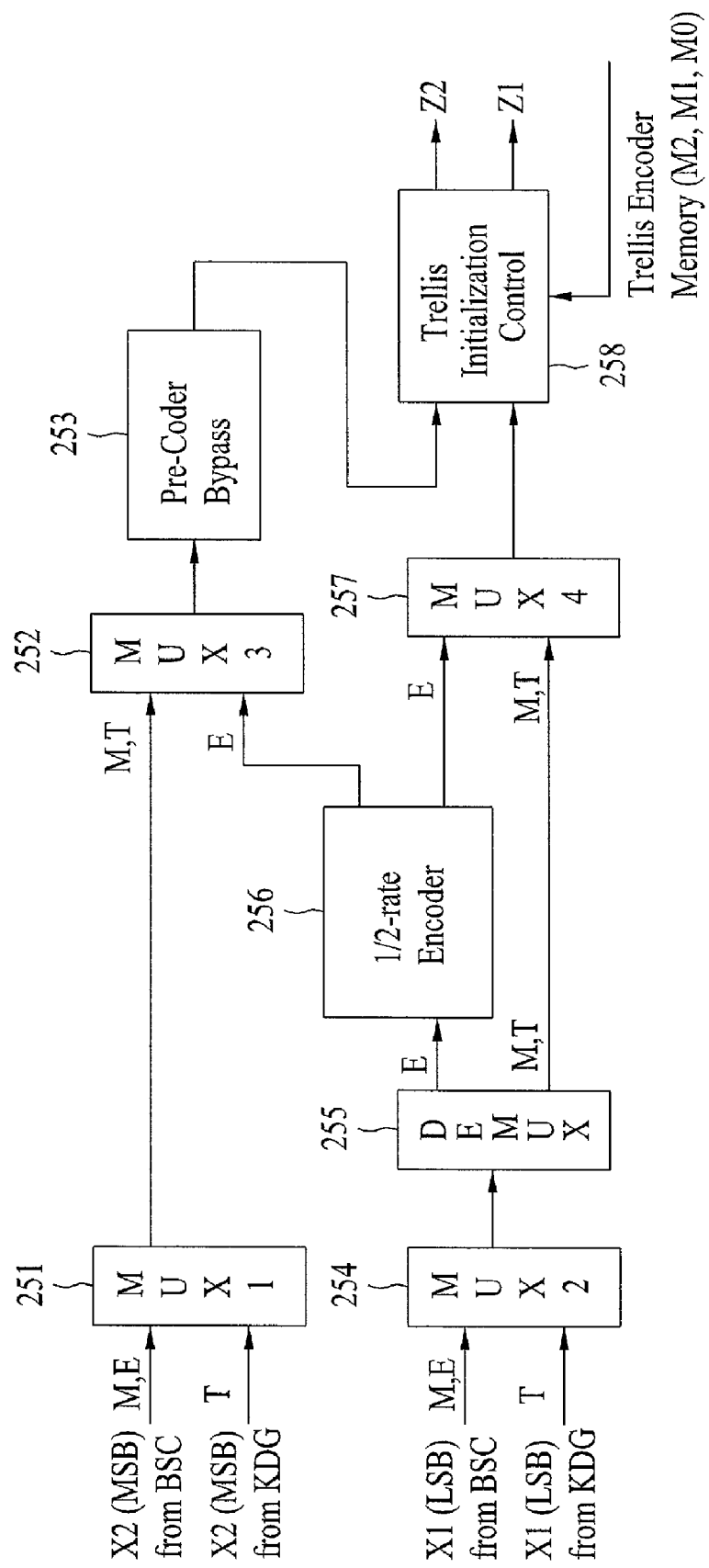
FIG. 2B illustrates a block view of an E-VSB symbol processor according to another embodiment of the present invention.

FIG. 2A and FIG. 2B illustrate block views of an E-VSB symbol processor according to preferred embodiments of the present invention. For simplicity of the description, M represents the main data symbol, T signifies the known data symbol, and E represents the enhanced data symbol. Herein, X2 corresponds to the upper bit among the 2 bits of the input symbol, and X1 corresponds to the lower bit. At this point, if the MPEG header byte inserted to the enhanced data packet and the parity byte inserted by the RS encoder are converted to symbols, the inserted bytes are processed as the main data symbol.

The E-VSB symbol processor of FIG. 2A includes first to fourth multiplexers 201, 206, 204, and 207, a demultiplexer 202, a ½-coding rate encoder (hereinafter referred to as a "½-rate encoder") 203, a pre-coder bypass unit 205, and a trellis initialization controller 208. Referring to FIG. 2A, when the input symbol is one of a main data symbol M and an enhanced data symbol E, the first multiplexer 201 selects an upper bit X2 of a symbol outputted from the byte-symbol converter 108. Alternatively, when the input symbol is a known data symbol or a known data place holder symbol T, the first multiplexer 201 selects an upper bit X2 of a symbol outputted from the known data generator 110. Thereafter, the first multiplexer 201 outputs the selected upper bit X2 to the demultiplexer 202.

Additionally, when the input symbol is one of a main data symbol M and an enhanced data symbol E, the second multiplexer 206 selects a lower bit X1 of the symbol outputted from the byte-symbol converter 108. And, when the input symbol is a known data symbol or a known data place holder symbol T, the second multiplexer 206 selects a lower bit X1 of the symbol outputted from the known data generator 110. Thereafter, the second multiplexer 206 outputs the selected lower bit X1 to the fourth multiplexer 207. When the output bit outputted from the first multiplexer 201 is one of the upper bit of the main data symbol and the upper bit of the known data symbol, the demultiplexer 202 outputs the output bit to the third multiplexer 204. Alternatively, when the output bit is the upper bit of the enhanced data symbol, the demultiplexer 202 outputs the output bit to the ½-coding rate encoder (hereinafter referred to as "½-rate encoder") 203.

The ½-rate encoder 203 operates only on the enhanced data symbol, thereby coding the upper bit of the enhanced data symbol at a ½ coding rate and outputting two bits. At this point, among the output bits, one is outputted to the pre-coder bypass unit 205 through the third multiplexer 204, and the other is outputted to the fourth multiplexer 207. When the input symbol is one of the main data symbol M and the known data symbol T, the third multiplexer 204 selects the output of the demultiplexer 202. And, when the input symbol is the enhanced data symbol 2, the third multiplexer 204 selects one output bit of the ½-rate encoder 203 and outputs the selected bit to the pre-coder bypass unit 205.

When the input data correspond to one of the enhanced data symbol, the pre-coder bypass unit 205 operates (or calculates) the input data, so that the pre-coder is bypassed in the trellis encoder 113 in a later process. Then the pre-coder bypass unit 205 outputs the operated (or calculated) data. When the input data correspond to the main data symbol or the known data symbol, the data are outputted without any change. The output of the pre-coder bypass unit 205 is then inputted to the trellis initialization controller 208. The operation of the pre-coder bypass unit 205 will be described in detail in a later process.

When the input symbol is the enhanced data symbol, the fourth multiplexer 207 selects the output bit of the ½-rate encoder 203 instead of the input bit and outputs the selected output bit. When the input symbol is one of the main data symbol and the known data symbol, the fourth multiplexer 207 selects the output bit of the second multiplexer 206 and outputs the selected output bit. Then, the selects bits are outputted to the trellis initialization controller 208.

The trellis initialization controller 208 generates data that enable the memory of the trellis encoder 113 to be initialized to a predetermined state, when the sequence of the known data symbol begins. Then, the trellis initialization controller 208 outputs the generated data instead of the known data. Furthermore, in the remaining section, the input data are bypassed without modification. The operation of the trellis initialization controller 208 will be described in detail in a later process. As a result, the E-VSB symbol processor of FIG. 2A encodes the upper bit X2 among the two input bits of the enhanced data symbol and, then, outputs two bits. Herein, the lower bit X1 is discarded.

FIG. 2B illustrates a block view of an E-VSB symbol processor according to another embodiment of the present invention. Herein, FIG. 2A and FIG. 2B are very similar to one another. However, the difference between the two E-VSB symbol processors is that, in the one shown in FIG. 2B, the lower bit X1 among the two input bits of the enhanced data symbol is encoded, thereby outputting two bits, whereas the upper bit X2 is discarded. Referring to FIG. 2B, when the input symbol is one of a main data symbol M and an enhanced data symbol E, the first multiplexer 251 selects an upper bit X2 of a symbol outputted from the byte-symbol converter 108. Alternatively, when the input symbol is a known data place holder symbol (or a known data symbol) T, the first multiplexer 251 selects an upper bit X2 of a symbol outputted from the known data generator 110. Thereafter, the first multiplexer 251 outputs the selected upper bit X2 to the third multiplexer 252.

Additionally, when the input symbol is one of a main data symbol M and an enhanced data symbol E, the second multiplexer 254 selects a lower bit X1 of the symbol outputted from the byte-symbol converter 108. And, when the input symbol is a known data symbol T, the second multiplexer 254 selects a lower bit X1 of the symbol outputted from the known data generator 110. Thereafter, the second multiplexer 254 outputs the selected lower bit X1 to the demultiplexer 255. When the output bit of the second multiplexer 254 is the enhanced data, the demultiplexer 255 outputs the output bit to the ½-rate encoder 256. Alternatively, when the output bit is the main data or the known data, the demultiplexer 255 outputs the output bit to the fourth multiplexer 257.

The ½-rate encoder 256 performs ½-rate coding on the enhanced data bit outputted from the demultiplexer 255, thereby generating 2 bits. Herein, one of the 2 bits is outputted to the third multiplexer 252, and the other bit is outputted to the fourth multiplexer 257. When the input data is one of the main data and the known data, the third multiplexer 252 selects the output bit of the first multiplexer 251. And, when the input data is the enhanced data, the third multiplexer 252 selects the output bit of the ½-rate encoder 256. Then, the third multiplexer 252 outputs the selected bit to the pre-coder bypass unit 253. When the input data correspond to the enhanced data, the pre-coder bypass unit 253 operates (or calculates) the input data, so that the pre-coder is bypassed in the trellis encoder in a later process. Then, the pre-coder bypass unit 253 outputs the operated (or calculated) data. When the input data correspond to the main data or the known data, the data are outputted without any change. The output of the pre-coder bypass unit 253 is then inputted to the trellis initialization controller 258.

When the input symbol is the enhanced data symbol, the fourth multiplexer 258 selects and outputs the other output bit of the ½-rate encoder 256. When the input symbol is the main data symbol or the known data symbol, the fourth multiplexer 258 selects the output bit of the demultiplexer 255 and outputs the selected bit to the trellis initialization controller 258. The trellis initialization controller 258 generates data that enable the memory of the trellis encoder 113 to be initialized to a predetermined state, when the sequence of the known data symbol begins. Then, the trellis initialization controller 258 outputs the generated data instead of the known data. Furthermore, in the remaining section, the input data are bypassed without modification. As a result, the E-VSB symbol processor of FIG. 2B encodes the lower bit X1 among the two input bits of the enhanced data symbol and, then, outputs two bits. Herein, the upper bit X2 is discarded.

Figure 3A:
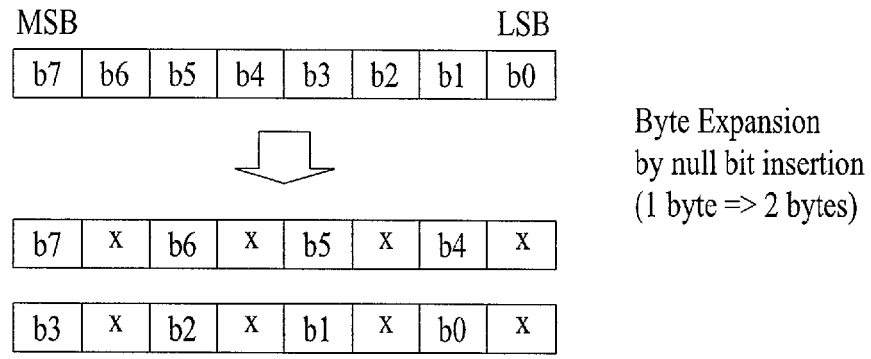
FIG. 3A to FIG. 3C illustrate examples of expanding one enhanced data byte to two bytes according to the present invention.
Figure 3B:
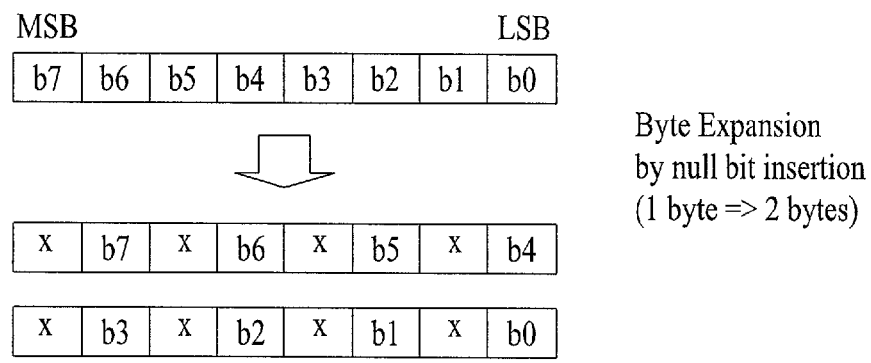
Figure 3C:
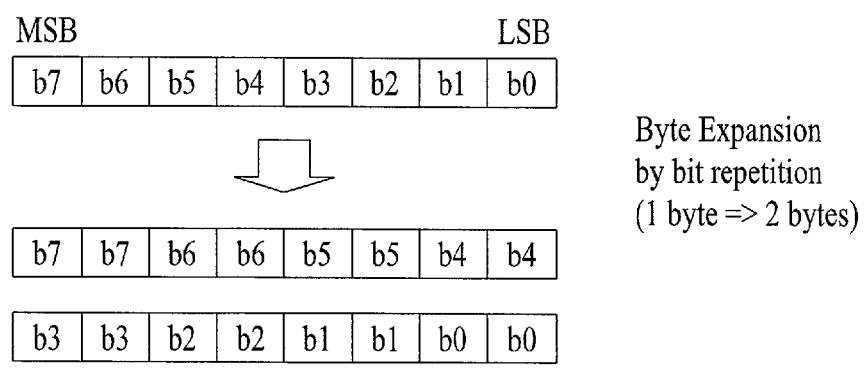
Figure 4A:
FIG. 4A to FIG. 4C illustrate examples of expanding one enhanced data byte to four bytes according to the present invention.
Figure 4B:
Figure 4C:
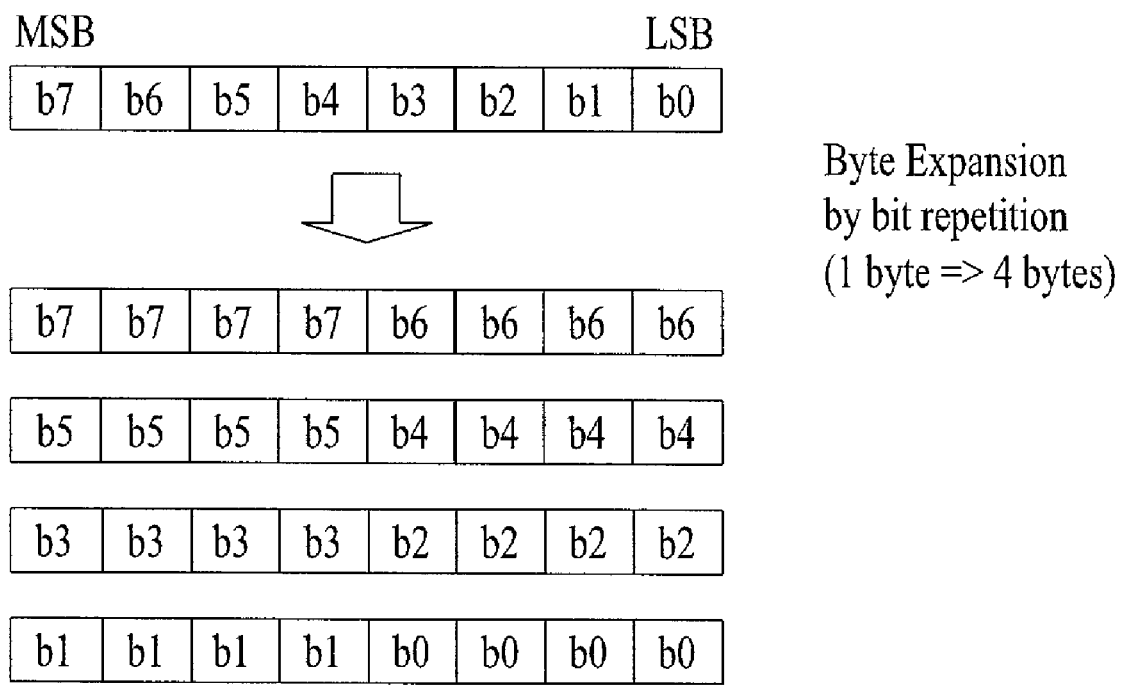

Meanwhile, the E-VSB pre-processor 101 of FIG. 1 performs pre-processing steps such as additional error correction encoding, byte expansion, and so on, on the enhanced data. At this point, the processing method of the E-VSB symbol processor may vary in accordance with the byte expansion method of the E-VSB pre-processor 101. Examples of the same are shown in FIG. 3A to FIG. 3C and also in FIG. 4A to FIG. 4C. Herein, FIG. 3A to FIG. 3C illustrate examples of expanding one enhanced data byte to two bytes according to the present invention. And, FIG. 4A to FIG. 4C illustrate examples of expanding one enhanced data byte to four bytes according to the present invention. FIG. 3A and FIG. 4A are most effective when applied to the E-VSB symbol processor of FIG. 2A. Alternatively, FIG. 3B and FIG. 4B are most effective when applied to the E-VSB symbol processor of FIG. 2B. FIG. 3C and FIG. 4C may be applied in any one of FIG. 2A and FIG. 2B. The byte expansion includes the method of inserting null data bits between each bit and the method of repeating each bit.

FIG. 3A illustrates an example of the E-VSB pre-processor 101 expanding one enhanced data byte to two bytes when using the E-VSB symbol processor shown in FIG. 2A. In the E-VSB symbol processor of FIG. 2A, only the upper bit of the enhanced data symbol is used and the lower bit is discarded. Therefore, as shown in FIG. 3A, the E-VSB pre-processor 101 inserts a null data bit x after each bit for one input byte, thereby outputting two bytes. In a later process, the outputted bytes are converted to a 2-bit unit symbol by the byte-symbol converter and inputted to the E-VSB symbol processor of FIG. 2A. At this point, the upper bit X2 of the input symbol includes information, and the lower bit X1 is a null data bit. Herein, the lower bit X1 is replaced with the output bit of the ½-rate encoder 203 by the fourth multiplexer 207 of FIG. 2A.

FIG. 3B an example of the E-VSB pre-processor 101 expanding one enhanced data byte to two bytes when using the E-VSB symbol processor shown in FIG. 2B. In the E-VSB symbol processor of FIG. 2B, only the lower bit of the enhanced data symbol is used and the upper bit is discarded. Therefore, as shown in FIG. 3B, the E-VSB pre-processor 101 inserts a null data bit x before each bit for one input byte, thereby outputting two bytes. In a later process, the outputted bytes are converted to a 2-bit unit symbol by the byte-symbol converter and inputted to the E-VSB symbol processor of FIG. 2B. At this point, the upper bit X2 is a null data bit, and the lower bit X1 of the input symbol includes information. Herein, the upper bit X2 is replaced with the output bit of the ½-rate encoder 256 by the third multiplexer 252 of FIG. 2B.

FIG. 3C illustrates yet another example of expanding one enhanced data byte to two bytes that can be applied to the E-VSB symbol processor of both FIG. 2A and FIG. 2B. The null data bit shown in FIG. 3A and FIG. 3B may be given an arbitrary value. Therefore, as shown in FIG. 3C, each bit for one input byte is repeated one time to be expanded to 2 bytes. This expansion method can be applied to the E-VSB symbol processor of both FIG. 2A and FIG. 2B.

FIG. 4A illustrates an example of the E-VSB pre-processor 101 expanding one enhanced data byte to four bytes when using the E-VSB symbol processor shown in FIG. 4A. In the E-VSB symbol processor of FIG. 2A, only the upper bit of the enhanced data symbol is used and the lower bit is discarded. Therefore, as shown in FIG. 4A, the E-VSB pre-processor 101 repeats each bit for one input byte so as to create 2 bits. Then, the E-VSB pre-processor 101 inserts a null data bit x after each bit including the repeated bits, thereby outputting four bytes. More specifically, the amount of data in the enhanced data is expanded to 4 times its initial size. The outputted bytes are converted to a 2-bit unit symbol by the byte-symbol converter and inputted to the E-VSB symbol processor of FIG. 2A. At this point, the upper bit X2 of the input symbol includes information, and the lower bit X1 is a null data bit. Herein, the lower bit X1 is replaced with the output bit of the ½-rate encoder 203 by the fourth multiplexer 207 of FIG. 2A.

FIG. 4B illustrates an example of the E-VSB pre-processor 101 expanding one enhanced data byte to four bytes when using the E-VSB symbol processor shown in FIG. 2B. In the E-VSB symbol processor of FIG. 2B, only the lower bit of the enhanced data symbol is used and the upper bit is discarded. Therefore, as shown in FIG. 4B, the E-VSB pre-processor 101 repeats each bit for one input byte so as to create 2 bits. Then, the E-VSB pre-processor 101 inserts a null data bit x before each bit including the repeated bits, thereby outputting four bytes. The outputted bytes are converted to a 2-bit unit symbol by the byte-symbol converter and inputted to the E-VSB symbol processor of FIG. 2B. At this point, the lower bit X1 of the input symbol includes information, and the upper bit X2 is a null data bit. Herein, the upper bit X2 is replaced with the output bit of the ½-rate encoder 256 by the third multiplexer 252 of FIG. 2B.

FIG. 4C illustrates yet another example of expanding one enhanced data byte to four bytes that can be applied to the E-VSB symbol processor of both FIG. 2A and FIG. 2B. The null data bit shown in FIG. 4A and FIG. 4B may be given an arbitrary value. Therefore, as shown in FIG. 4C, each bit for one input byte is repeated four times to be expanded to 2 bytes. This expansion method can be applied to the E-VSB symbol processor of both FIG. 2A and FIG. 2B. By expanding the data byte as shown in FIG. 4A to FIG. 4C, each bit is coded with a ½-coding rate twice by the E-VSB symbol processor, which results in a coding rate of ¼ (hereinafter referred to as a ¼-coding rate) of the bits.

Figure 5:
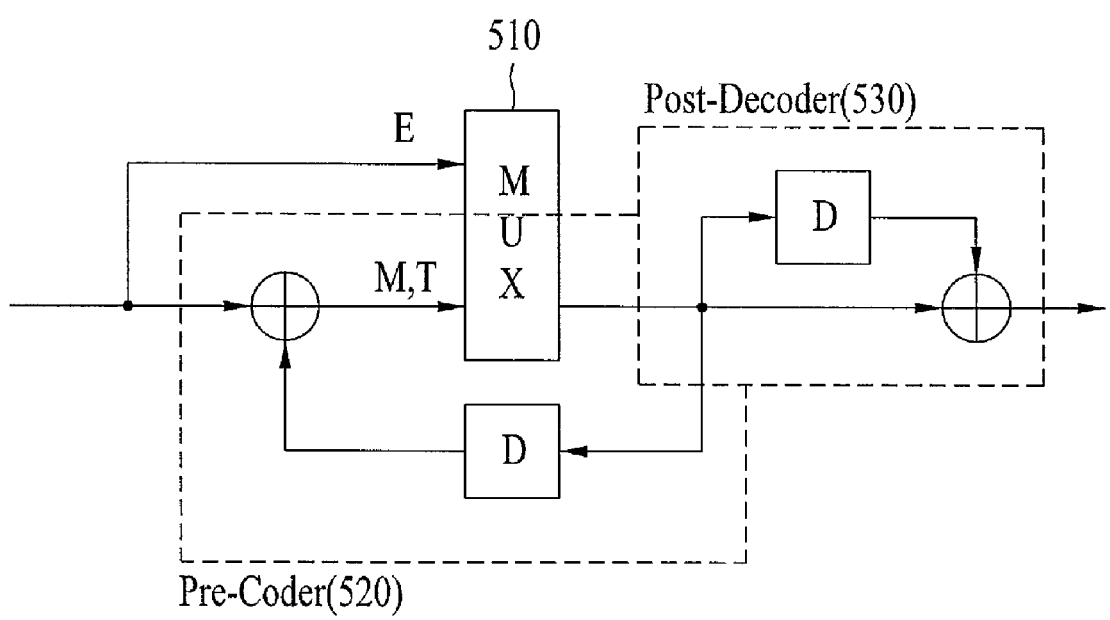
FIG. 5 illustrates a block view of a pre-coder bypass unit according to an embodiment of the present invention.

FIG. 5 illustrates a block view of the pre-coder bypass unit 205 or 253 included in the E-VSB symbol processor. Referring to FIG. 5, the pre-coder bypass unit according to the present invention includes a multiplexer 510, a pre-coder 520, and a post-decoder 530. Herein, the post-decoder 530 performs an inverse process of the pre-coder 520. The multiplexer 510 selects either an input bit or an output bit of the pre-coder 520 in accordance with the input data symbol type. Then, the multiplexer 510 outputs the selected input bit or output bit to the post-decoder 530. If the input data is an enhanced data symbol, the multiplexer 510 selects the input bit. Conversely, if the input data is a main data symbol or a known data symbol, the multiplexer 510 selects the output bit of the pre-coder 520. Thereafter, the selected bit is outputted to the post-decoder 530. Accordingly, the post-decoder 530 post-decodes and outputs the output of the multiplexer 510.

If a main data symbol or a known data symbol is inputted to the pre-coder bypass unit of FIG. 5, the inputted main data symbol or known data symbol sequentially passes through the pre-coder 520 and the post-decoder 530. Therefore, a value equal to that of the input bit is outputted. Accordingly, when the main data pass through the pre-coder included in the trellis encoder, the main data and/or the known data are pre-coded. Meanwhile, when the enhanced data symbol is inputted, the input symbol only passes through the post-decoder 530. This indicates that when the symbol passes though the pre-coder of the trellis encoder, the enhanced data symbol bypasses the pre-coder.

Figures 6A, 6B:
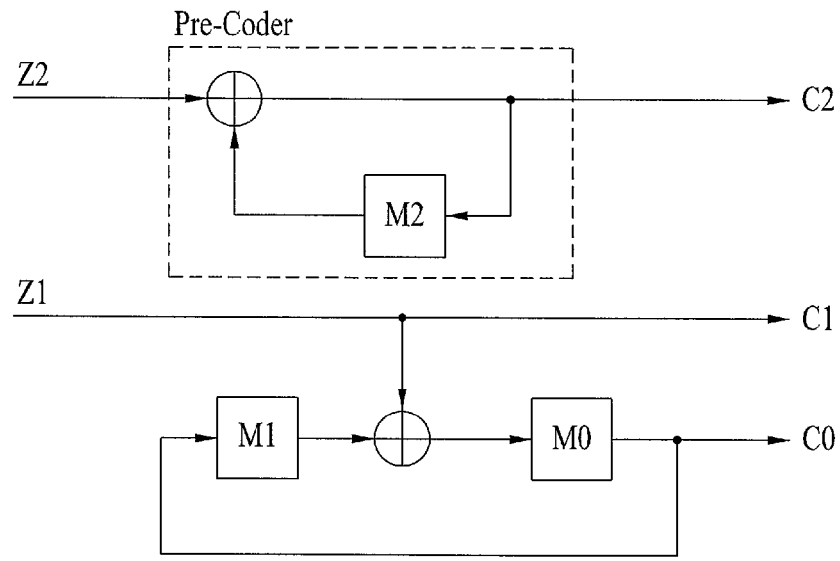
FIG. 6A illustrates a block view of a trellis encoder according to an embodiment of the present invention.
FIG. 6B illustrates an example of an input symbol for initializing a memory of the trellis encoder according to the present invention.

FIG. 6A illustrates a detailed block view of the trellis encoder 113. Herein, two input bits Z1 and Z2 are coded so as to output three bits C0 to C2. The upper bit Z2 of the input bit uses a memory M2 so as to be pre-coded and outputted as C2. Alternatively, the lower bit Z1 of the input bit uses the memories M0 and M1, so as to be trellis-encoded and outputted as C0 and C1, respectively. The output C2C1C0 of the trellis encoder 113 is mapped to an 8-level VSB signal and outputted. More specifically, the trellis encoder 113 pre-codes the upper bit Z2 of the output symbol outputted from the E-VSB symbol processor 109, and outputs the pre-coded upper bit as C2. Furthermore, the trellis encoder 113 trellis-encodes the lower bit Z1 and outputs the trellis-encoded lower bit as C1 and C0. Therefore, the memory M2 of the trellis encoder 113 is decided only by Z2, and the memories M1 and M0 are decided only by Z1.

As shown in FIG. 6A, one Z2 is required to initialize the memory M2 of the trellis encoder to a specific value, and two Z1 are required to initialize each of the memories M1 and M0 to a specific value. Therefore, in order to initialize the memories M2, M1, and M0 of the trellis encoder, at least two input symbols are required. FIG. 6B describes a process of inputting two symbols required for initializing an arbitrary memory state M2M1M0 to '000'. For example, when the state of the memory MM21M0 is equal to '111' (i.e., when M2M1M0=111), in order to initialize the memory M2M1M0 to '000', the input bits Z2Z1 should be consecutively inputted as '01' and '11' or as '11' and '01'.

The trellis initialization controller of the E-VSB symbol controller receives the memory value of the trellis encoder and, then, uses the table shown in FIG. 6B so as to output the input symbol sequence required for the initializing process. If the memory state of the trellis encoder that is to be initialized is not equal to '000', two symbol sequences different from the ones shown in FIG. 6B are required. However, since such sequences may be easily deduced, a detailed description of such process will be omitted for simplicity.

As described above, the trellis initialization controller generates data so that a memory may be initialized to a pre-decided state in accordance with the memory state of the trellis encoder during the first two symbol periods at the beginning of the known data symbol sequence. Subsequently, the trellis initialization controller outputs the newly generated initialization data instead of the input data. Thereafter, during the remaining symbol periods, the input data are outputted without modification. The memory of the trellis encoder is initialized so that the known data may be maintained as the known data even after being trellis-encoded. Evidently, the known data symbol being outputted from the trellis encoder is different from the known data symbol being inputted to the trellis encoder.

Figure 7:
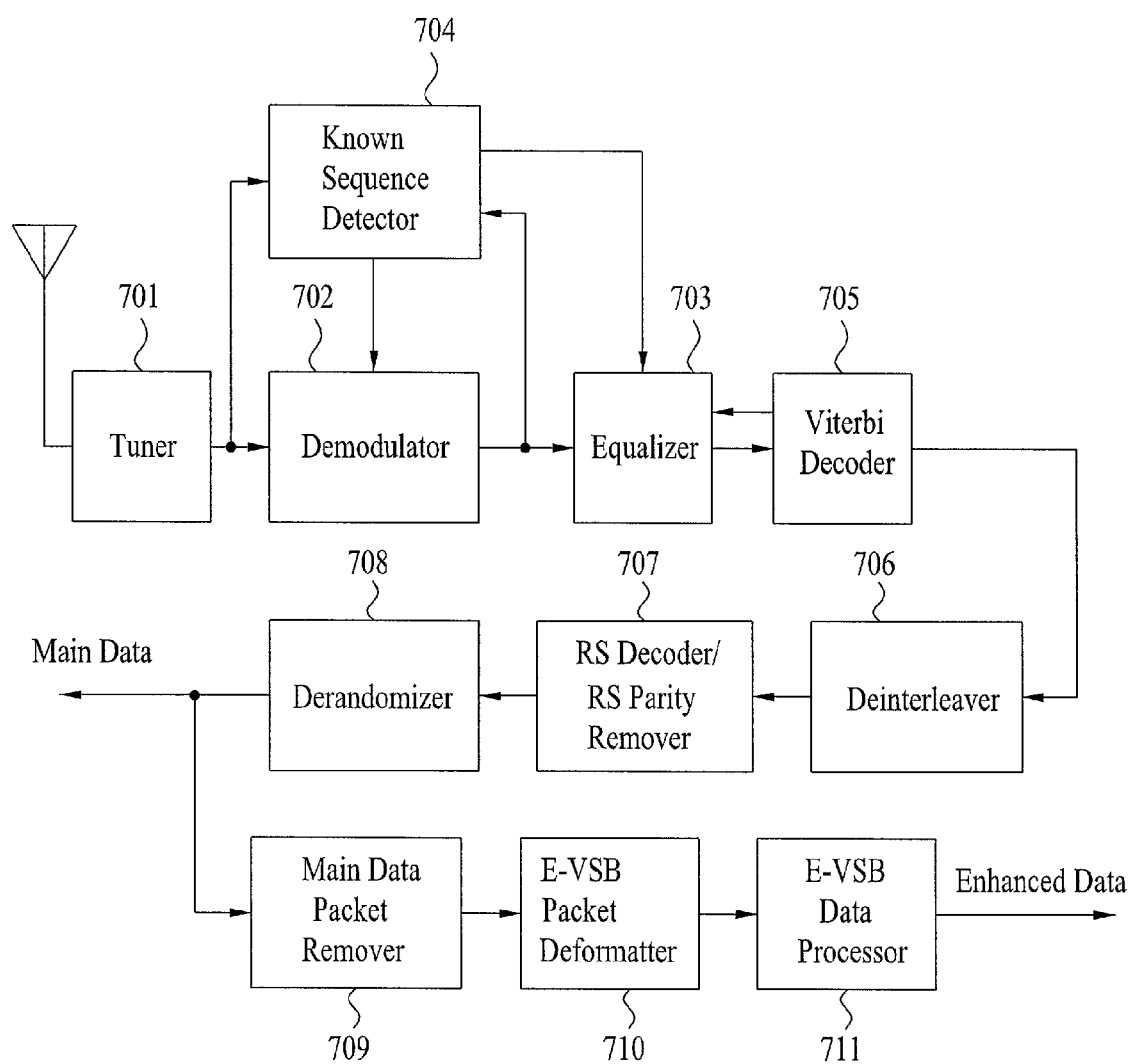
FIG. 7 illustrates a block view showing a general structure of a digital broadcast receiving system according to an embodiment of the present invention.

FIG. 7 illustrates a block diagram showing the structure of a digital broadcast receiving system that receives data transmitted from the digital broadcast transmitting system shown in FIG. 1 and then demodulates and equalizes the received data to recover the data to the initial data. Referring to FIG. 7, the digital broadcast receiver includes a tuner 701, a demodulator 702, an equalizer 703, a known data detector 704, a Viterbi decoder 705, a data deinterleaver 706, a RS decoder/non-systematic RS parity remover 707, and a derandomizer 708. The digital broadcast receiver further includes a main data packet remover 709, an E-VSB packet deformatter 710, and an E-VSB data processor 711.

More specifically, the tuner 701 tunes the frequency of a particular channel. Subsequently, the tuner 701 down-converts the tuned channel frequency and outputs the tuned channel frequency to the demodulator 702 and the known data detector 704. The demodulator 702 demodulates the tuned channel frequency so as to perform carrier recovery and timing recovery, thereby creating a baseband signal. Then, the demodulator 702 outputs the created baseband signal to the equalizer 703 and the known data detector 704. The equalizer 703 compensates for any channel distortion included in the demodulated signal. Thereafter, the equalizer 703 outputs the processed signal to the Viterbi decoder 705.

At this point, the known data detector 704 detects the known data symbol sequence inserted from the transmitting system from the input/output data of the demodulator 702 (i.e., the data prior to demodulation or the data after demodulation). Then, the known data detector 704 outputs the detected sequence to the demodulator 702 and the equalizer 703. When the demodulator 702 uses the known data symbol sequence during the timing recovery or the carrier recovery, the demodulating performance may be enhanced. Similarly, when the equalizer 703 uses the known data symbol sequence, the equalization performance may be enhanced.

The Viterbi decoder 705 Viterbi-decodes the main symbol and the enhanced data symbol outputted from the equalizer 703, so as to convert the symbols into data bytes, thereby outputting the newly converted data bytes to the deinterleaver 706. The 8-level value decided by the Viterbi decoder 705 is provided to the equalizer 703 so as to enhance the equalizing performance. The deinterleaver 706 performs the inverse operation of the data interleaver of the transmitting system and, then, outputs the processed data to the RS decoder/non-systematic RS parity remover 707. If the received packet is the main data packet, the RS decoder/non-systematic RS parity remover 707 RS-decodes the received packet. Alternatively, if the received packet is the enhanced data packet, the RS decoder/non-systematic RS parity remover 707 removes the non-systematic RS parity byte from the received packet. Thereafter, the processed packet is outputted to the derandomizer 708.

The derandomizer 70B performs an inverse process of the randomizer so as to process the output of the RS decoder/non-systematic RS parity remover 707. Subsequently, the derandomizer 708 inserts a MPEG synchronization data byte at the beginning of each packet and outputs the processed packet in 188-byte units. The output of the derandomizer 708 is outputted to the main MPEG decoder (not shown) and to the main data packet remover 709 at the same time.

Meanwhile, the main data packet remover 709 removes the 188-byte unit main data packet from the data outputted from the derandomizer 708 and outputs the processed data to the E-VSB packet deformatter 710. Subsequently, the E-VSB packet deformatter 710 removes (or discards) the 4-byte MPEG header byte and the known data byte that have been inserted by the E-VSB packet formatter of the transmitting system, and also removes the null bit or repetition bit that has been inserted for the byte expansion from the processed data. Thereafter, the E-VSB packet deformatter 710 outputs the processed data to the E-VSB data processor 711. The E-VSB data processor 711 performs an inverse process of the E-VSB pre-processor 101 of the transmitting system, so as to process the data outputted from the E-VSB packet deformatter 710. Subsequently, the E-VSB data processor 711 outputs the final output data.

As described above, the digital broadcasting system, method, and data structure according to the present invention has the following advantages. More specifically, the digital broadcasting system, method, and data structure according to the present invention is highly protected against (or resistant to) any error that may occur when transmitting supplemental data through a channel. And, the present invention is also highly compatible to the conventional receiving system. Moreover, the present invention may also receive the supplemental data without any error even in channels having severe ghost effect and noise.

Additionally, by inserting known data in a specific place (or position) of the data domain and transmitting the processed data, the receiving performance of the digital broadcast (or digital television) receiver liable to a frequent change in channel may be enhanced. The present invention is even more effective when applied to mobile and portable receivers, which are also liable to a frequent change in channel and which require protection (or resistance) against intense noise. Furthermore, ½-rate coding is additionally performed on the enhanced data symbol, which bypasses the pre-coder so as to be outputted. Thus, the problems of noise and ghost effect in the channel may be resolve, thereby enhancing the performance.

Furthermore, by outputting the known data as the lower bit of the enhanced data symbol and trellis-encoding the outputted lower bit, or by outputting the memory value of the trellis encoder as the upper bit of the enhanced data symbol and trellis-encoding the outputted memory value, the slicing performance of the receiver may also be enhanced. Finally, when the input data correspond to the enhanced data packet, by deciding the parity byte place so that the parity byte is outputted the latest among the bytes in the domain excluding the MPEG header byte and the known data byte, in accordance with the output of the data interleaver, the degree of freedom for deciding the inserting position of the known data sequence may be increased, thereby enabling a long known data sequence to be provided consecutively to the receiver.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing digital broadcast data in a broadcast receiver, the method comprising:
receiving a broadcast signal including main data, enhanced data and known data;
compensating channel distortion of the received broadcast signal using the received known data;
inner decoding the channel-distortion compensated broadcast signal; and
outer decoding the inner-decoded broadcast signal,
wherein the received broadcast signal results from:
pre-coding original enhanced data for forward error correction (FEC), generating enhanced data packets including the pre-coded original enhanced data, multiplexing the enhanced data packets with main data packets including original main data, Reed-Solomon (RS)-coding the multiplexed main and enhanced data packets, wherein the main data packets are RS-coded with a systematic RS encoding scheme and the enhanced data packets are RS-coded with a non-systematic RS encoding scheme, and wherein 47th, 48th, 49th, 50th and 51st bytes in at least one of the RS-coded enhanced data packets are non-systematic parity data, interleaving data in the RS-coded main and enhanced data packets, and trellis-encoding, by a trellis encoder, the interleaved data, the trellis encoder being initialized at a beginning of the known data.

2. The method of claim 1, wherein the received broadcast signal results from:

re-calculating parity data of the original enhanced data for backward compatibility.

3. The method of claim 1, wherein trellis-encoding the interleaved data comprises pre-coding a first bit among symbols of the interleaved data, and trellis-encoding a second bit among the symbols of the interleaved data.

4. The method of claim 1, wherein the broadcast signal further includes segment synchronization symbols and field synchronization symbols.

5. A broadcast receiver for processing digital broadcast data, the broadcast receiver comprising:

a receiving unit for receiving a broadcast signal including main data, enhanced data and known data;

an equalizer for compensating channel distortion of the received broadcast signal using the received known data;

a first decoder for inner decoding the channel-distortion compensated broadcast signal; and a second decoder for outer decoding the inner-decoded broadcast signal, wherein the received broadcast signal results from:

pre-coding original enhanced data for forward error correction (FEC), generating enhanced data packets including the pre-coded original enhanced data, multiplexing the enhanced data packets with main data packets including original main data, Reed-Solomon (RS)-coding the multiplexed main and enhanced data packets, wherein the main data packets are RS-coded with a systematic RS encoding scheme and the enhanced data packets are RS-coded with a non-systematic RS encoding scheme, and wherein 47th, 48th, 49th, 50th and 51st bytes in at least one of the RS-coded enhanced data packets are non-systematic parity data, interleaving data in the RS-coded main and enhanced data packets, and trellis-encoding, by a trellis encoder, the interleaved data, the trellis encoder being initialized at a beginning of the known data.

6. The broadcast receiver of claim 5, wherein the received broadcast signal results from:

re-calculating parity data of the original enhanced data for backward compatibility.

7. The broadcast receiver of claim 5, wherein the trellis encoder pre-codes a first bit among symbols of the interleaved data, and trellis-encodes a second bit among the symbols of the interleaved data.

8. The broadcast receiver of claim 5, wherein the broadcast signal further includes segment synchronization symbols and field synchronization symbols.

* * * * *